United States Patent
Nakamoto et al.

(10) Patent No.: US 12,091,323 B2
(45) Date of Patent: *Sep. 17, 2024

(54) AMORPHOUS SILICON FORMING COMPOSITION COMPRISING BLOCK COPOLYMER AND METHOD FOR PRODUCING AMORPHOUS SILICON FILM USING SAME

(71) Applicant: Merck Patent GmbH, Darmstadt (DE)

(72) Inventors: Naoko Nakamoto, Kakegawa (JP); Takashi Fujiwara, Kakegawa (JP); Atsuhiko Sato, Kakegawa (JP)

(73) Assignee: Marck Patent GmbH, Darmstadt (DE)

( * ) Notice: Subject to any disclaimer, the term of this patent is extended or adjusted under 35 U.S.C. 154(b) by 423 days.

This patent is subject to a terminal disclaimer.

(21) Appl. No.: 17/298,549

(22) PCT Filed: Nov. 26, 2019

(86) PCT No.: PCT/EP2019/082577
§ 371 (c)(1),
(2) Date: May 29, 2021

(87) PCT Pub. No.: WO2020/109298
PCT Pub. Date: Jun. 4, 2020

(65) Prior Publication Data
US 2022/0017373 A1 Jan. 20, 2022

(30) Foreign Application Priority Data

Nov. 29, 2018 (JP) ................................ 2018-223636

(51) Int. Cl.
*C01B 33/021* (2006.01)
*C08G 77/452* (2006.01)
*C09D 183/16* (2006.01)
*H01L 21/3205* (2006.01)

(52) U.S. Cl.
CPC .......... *C01B 33/021* (2013.01); *C08G 77/452* (2013.01); *C09D 183/16* (2013.01); *H01L 21/32055* (2013.01); *C01P 2002/02* (2013.01)

(58) Field of Classification Search
CPC ......... H01L 21/32055; H01L 21/02211; H01L 21/02222; H01L 21/3125; C08G 77/62; C08G 77/60; C08G 77/42; C08G 77/452; C08G 77/045; C08G 77/06; C08G 77/12; C08G 77/20; C08G 77/50; C08G 77/80; C08G 77/54; C08G 77/04; C08G 83/00; C08G 83/16; C08G 83/04; C08G 2205/02; C08G 2205/025; C08G 2205/035; C08G 63/00; C08G 71/12; C08G 75/04; C01B 33/021

See application file for complete search history.

(56) References Cited

U.S. PATENT DOCUMENTS

| | | | |
|---|---|---|---|
| 7,118,943 B2 | 10/2006 | Yudasaka et al. | |
| 8,455,604 B1 | 6/2013 | Guo et al. | |
| 8,658,284 B2* | 2/2014 | Chen | C09D 183/16 524/588 |
| 11,401,384 B2* | 8/2022 | Fujiwara | C09D 183/10 |
| 11,466,127 B2* | 10/2022 | Fujiwara | C08G 77/62 |
| 2008/0305611 A1 | 12/2008 | Hirota | |
| 2013/0214383 A1* | 8/2013 | Nakamoto | H01L 21/3105 438/433 |
| 2015/0093545 A1 | 4/2015 | Han et al. | |
| 2015/0225508 A1 | 8/2015 | Song et al. | |
| 2022/0009782 A1* | 1/2022 | Nakamoto | C08L 83/16 |

FOREIGN PATENT DOCUMENTS

| | | |
|---|---|---|
| TW | 201425481 A | 7/2014 |
| WO | 2011/053551 A1 | 5/2011 |
| WO | 2019/233838 A1 | 12/2019 |

OTHER PUBLICATIONS

International Preliminary Report on Patentability received for PCT Patent Application No. PCT/EP2019/082577, dated Jun. 10, 2021, 9 pages.
International Search Report and Written Opinion received for PCT Patent Application No. PCT/EP2019/082577, dated Jan. 24, 2020, 11 pages.

\* cited by examiner

*Primary Examiner* — Jose R Diaz
(74) *Attorney, Agent, or Firm* — Faegre Drinker Biddle & Reath LLP

(57) ABSTRACT

To provide an amorphous silicon forming composition, which has high affinity with a substrate, is excellent in filling properties, and is capable of forming a thick film. [Means for Solution] An amorphous silicon forming composition comprising: (a) a block copolymer comprising a linear and/or cyclic block A having a polysilane skeleton comprising 5 or more silicon and a block B having a polysilazane skeleton comprising 20 or more silicon, wherein at least one silicon in the block A and at least one silicon in the block B are connected by a single bond and/or a crosslinking group comprising silicon, and (b) a solvent.

19 Claims, No Drawings

AMORPHOUS SILICON FORMING COMPOSITION COMPRISING BLOCK COPOLYMER AND METHOD FOR PRODUCING AMORPHOUS SILICON FILM USING SAME

CROSS-REFERENCE TO RELATED APPLICATIONS

This application is a national stage application (under 35 U.S.C. § 371) of PCT/EP2019/082577, filed Nov. 26, 2019, which claims benefit of Japanese Application No. 2018-223636, filed Nov. 29, 2018, both of which are incorporated herein by reference in their entirety.

BACKGROUND OF THE INVENTION

Technical Field

The present invention relates to an amorphous silicon forming composition comprising a block copolymer comprising a block having a polysilane skeleton and a block having a polysilazane skeleton, and a method for producing an amorphous silicon film using the same.

Background Art

Electronic devices, especially semiconductor devices, comprise thin films such as semiconductor films, insulating films, and conductive films. Silicon films are used as a semiconductor film, an etching mask when processing an insulating film, and a sacrifice film when manufacturing a metal gate.

As a method for forming the amorphous silicon film and polycrystalline silicon, a chemical vapor deposition method (CVD method), an evaporation method, a sputtering method, and the like are used. In the advanced node, when the CVD process is used excessive growth for narrow trenches is caused, so that repeated etching and CVD are required. Under such a circumstance, it is required to make possible to fill trenches narrower than 10 to 20 nm using a spin-on process comprising applying a liquid composition and baking it to form a film.

Further, it is required to be capable of forming a thicker film than before.

When a film is formed by using a composition comprising hydrogenated polysilane for spin-on process, since the affinity with the substrate is low, the case in which a film can be formed using this is very limited.

PRIOR ART DOCUMENTS

Patent Documents

[Patent document 1] U.S. Pat. No. 8,455,604
[Patent Document 2] U.S. Pat. No. 7,118,943

SUMMARY OF THE INVENTION

Problems to be Solved by the Invention

The present invention has been made based on the background art as described above and provides an amorphous silicon forming composition, which has high affinity with a substrate, is excellent in filling properties, and is capable of forming a thick film.

Means for Solving the Problems

The amorphous silicon forming composition according to the present invention comprises:
(a) a block copolymer comprising a linear and/or cyclic block A having a polysilane skeleton comprising 5 or more silicon and a block B having a polysilazane skeleton comprising 20 or more silicon, wherein at least one silicon in the block A and at least one silicon in the block B are connected by a single bond and/or a crosslinking group comprising silicon, and
(b) a solvent.

The method for producing the amorphous silicon film according to the present invention comprises:
applying above mentioned amorphous silicon forming composition above a substrate to form a coating film, and heating the coating film.

The method for manufacturing an electronic device according to the present invention comprises the above mentioned method for producing amorphous silicon.

Effects of the Invention

According to the present invention, an amorphous silicon forming composition, which has high affinity with a substrate, is excellent in filling properties, and is capable of forming a thick film, can be provided. The amorphous silicon film formed using this composition is resistant to hydrofluoric acid and can be removed with an aqueous alkaline solution. Furthermore, the film has heat resistance as well.

DETAILED DESCRIPTION OF THE INVENTION

Mode for Carrying Out the Invention

Embodiments of the present invention are described below in detail. Hereinafter, symbols, units, abbreviations, and terms have the following meanings in the present specification unless otherwise specified.

In the present specification, when numerical ranges are indicated using "to", they include both end points, and the units thereof are common. For example, 5 to 25 mol % means 5 mol % or more and 25 mol % or less.

In the present specification, the hydrocarbon means one including carbon and hydrogen, and optionally including oxygen or nitrogen. The hydrocarbyl group means a monovalent or divalent or higher valent hydrocarbon.

In the present specification, the aliphatic hydrocarbon means a linear, branched or cyclic aliphatic hydrocarbon, and the aliphatic hydrocarbon group means a monovalent or divalent or higher valent aliphatic hydrocarbon. The aromatic hydrocarbon means a hydrocarbon comprising an aromatic ring which may optionally not only comprise an aliphatic hydrocarbon group as a substituent but also be condensed with an alicycle. The aromatic hydrocarbon group means a monovalent or divalent or higher valent aromatic hydrocarbon. These aliphatic hydrocarbon groups and aromatic hydrocarbon groups optionally contain fluorine, oxy, hydroxy, amino, carbonyl, or silyl and the like. Further, the aromatic ring means a hydrocarbon comprising a conjugated unsaturated ring structure, and the alicycle means a hydrocarbon comprising a ring structure but no conjugated unsaturated ring structure.

In the present specification, the alkyl means a group obtained by removing any one hydrogen from a linear or branched, saturated hydrocarbon and includes a linear alkyl and branched alkyl, and the cycloalkyl means a group obtained by removing one hydrogen from a saturated hydrocarbon comprising a cyclic structure and includes a linear or branched alkyl in the cyclic structure as a side chain, if necessary.

In the present specification, the aryl means a group obtained by removing any one hydrogen from an aromatic hydrocarbon. The alkylene means a group obtained by removing any two hydrogen from a linear or branched, saturated hydrocarbon. The arylene means a hydrocarbon group obtained by removing any two hydrogen from an aromatic hydrocarbon.

In the present specification, the description such as "$C_{x-y}$", "$C_x$-$C_y$" and "$C_x$" means the number of carbons in the molecule or substituent group. For example, $C_{1-6}$ alkyl means alkyl having 1 to 6 carbons (such as methyl, ethyl, propyl, butyl, pentyl and hexyl). Further, the fluoroalkyl as used in the present specification refers to one in which one or more hydrogen in alkyl is replaced with fluorine, and the fluoroaryl is one in which one or more hydrogen in aryl are replaced with fluorine.

In the present specification, when a polymer comprises plural types of repeating units, these repeating units copolymerize. These copolymerizations can be any of alternating copolymerization, random copolymerization, block copolymerization, graft copolymerization, or any mixture thereof.

In the present specification, "%" represents weight % and "ratio" represents ratio by weight.

In the present specification, Celsius is used as the temperature unit. For example, 20 degrees means 20 degrees Celsius.

<Amorphous Silicon Forming Composition>

The amorphous silicon forming composition according to the present invention (hereinafter sometimes referred to as the composition) comprises:
(a) a block copolymer comprising a linear and/or cyclic block A having a polysilane skeleton comprising 5 or more silicon and a block B having a polysilazane skeleton comprising 20 or more silicon, wherein at least one silicon in the block A and at least one silicon in the block B are connected by a single bond and/or a crosslinking group comprising silicon (hereinafter sometimes referred to as the block copolymer); and
(b) a solvent.

(a) Block Copolymer

The block copolymer used for the present invention comprises:
a linear and/or cyclic block A having a polysilane skeleton comprising 5 or more silicon; and
a block B having a polysilazane skeleton comprising 20 or more silicon,
wherein at least one silicon in the block A and at least one silicon in the block B are connected by a single bond and/or a crosslinking group comprising silicon.

In the present invention, the block copolymer refers to a polymer comprising at least one block A described above and at least one block B described above. When plural block A or plural block B exist, they can be different structures, respectively. The block A and the block B can be arranged at random or can be alternately arranged. Further, like a graft polymer, for example, one or plural block A can be connected in some places, like a branch, to a block B that serves as a trunk. A plurality of block A can be connected, as side chains, to a main chain comprising the block B.

Further, between the blocks may be directly linked, or may be linked via, for example, a silicon compound.

Furthermore, in one molecule, a block A and a block B, a block A and another block A, or a block B and another block B can be bonded by crosslinking.

In the present invention, the polysilane skeleton refers to a skeleton having a main chain composed only of Si—Si bonds.

In the present invention, the polysilazane skeleton refers to a skeleton having a main chain composed of repeating units of Si—N bond.

Preferably, the block A comprises 5 or more repeating units selected from the group consisting of the following formulae (I-1) to (I-3):

(I-1)

(I-2)

(I-3)

(wherein $R^{Ia}$, $R^{Ib}$ and $R^{Ic}$ are each independently hydrogen, halogen, $C_{1-6}$ alkyl or $C_{6-10}$ aryl), and the block B comprises 20 or more repeating units selected from the group consisting of the following formulae (II-1) to (II-6):

(II-1)

(II-2)

(II-3)

(II-4)

(II-5)

(II-6)

(wherein $R^{IIa}$ to $R^{IIi}$ are each independently hydrogen or $C_{1-4}$ alkyl).

Examples of $R^{Ia}$, $R^{Ib}$ and $R^{Ic}$ in the block A include hydrogen, methyl, ethyl, n-propyl, isopropyl, n-butyl, isobutyl, phenyl, tolyl and xylyl. Preferably, all of $R^{Ia}$, $R^{Ib}$ and $R^{Ic}$ are hydrogen.

Although the combination of the repeating units (I-1), (I-2) and (I-3) is not particularly limited, it is preferable that at least one of (I-2) or (I-3) is contained.

The number of the block A in one molecule is preferably 1 to 95, more preferably 3 to 90.

In the case where the block A is linear, the total number of repeating units of the formulae (I-1) to (I-3) constituting one block A is preferably 5 to 20, more preferably 5 to 15. At this time, it is preferable that each repeating unit is directly bonded to form Si—Si bond.

It is preferable that at least one of the block A is one represented by the following formula (I-4):

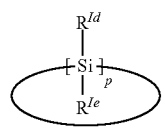

(I-4)

(wherein $R^{Id}$ and $R^{Ie}$ are each independently hydrogen, halogen, $C_{1-6}$ alkyl, $C_{6-10}$ aryl or a single bond, provided that at least one of $R^{Id}$ and $R^{Ie}$ is a single bond, and p is an integer of 5 or more).

Preferably, p is 5 or 6.

Preferably, the above single bond is directly linked to silicon in another block A or the block B.

Preferably, one of $R^{Id}$ and $R^{Ie}$ is a single bond and all of the others are hydrogen.

Examples of $R^{IIa}$ to $R^{IIi}$ in the block B include hydrogen, methyl, ethyl, n-propyl, isopropyl, n-butyl and isobutyl. Preferably, all of $R^{IIa}$ to $R^{IIi}$ are hydrogen.

Although the combination of the repeating units (II-1) to (II-6) is not particularly limited, it is preferable that at least one of (II-3) to (II-6) is contained.

The number of the repeating units in one block B is 20 or more, preferably 20 to 330, more preferably 20 to 130. It is preferable that each repeating unit is directly bonded without intervening any repeating unit other than (II-1) to (II-6).

The number of the block B in one molecule is preferably 1 to 24, more preferably 1 to 6.

The block copolymer used for the present invention preferably further comprises a crosslinking group comprising silicon, which crosslinks the block A each other, the block B each other, or between the block A and the block B.

Examples of the crosslinking group comprising silicon include —$Si_2R_4$— (wherein R is each independently hydrogen, halogen, alkyl or alkoxy, preferably hydrogen or Cl).

Although the combination of the block A and the block B is not particularly limited, the ratio of the total number of the repeating units of formulae (I-1) to (I-3) to that of the repeating units of the formulae (II-1) to (II-6) (in the present invention, sometimes referred to as "repeating unit ratio") is preferably 8 to 100%, more preferably 15 to 95%.

As the method for measuring the repeating unit ratio, for example, in the spectrum obtained by quantitative $^{29}$Si—NMR in accordance with inverse gate decoupling method (in the present invention, sometimes referred to as "$^{29}$Si—NMR"), it can be measured by a ratio of the peak area detected at −95 ppm to −115 ppm with respect to the peak area detected at −25 ppm to −55 ppm.

In the present invention, the measurement of $^{29}$Si-NMR can be specifically carried out as follows.

First, a solvent is removed, using an evaporator, from the block copolymer according to the present invention obtained by synthesis, and 0.4 g of the obtained block copolymer is dissolved in 1.6 g of a deuterated solvent such as deuterated chloroform (manufactured by Kanto Chemical Co., Inc.) to obtain a sample solution. Using a JNM-ECS 400 type nuclear magnetic resonance apparatus (trade name, manufactured by JEOL Ltd.), a $^{29}$Si—NMR spectrum of the sample solution is obtained by measuring 1,000 times. In NMR spectra, a peak assigned to Si containing in a polysilazane skeleton (δ=about −25 to −55 ppm) and a peak assigned to Si containing in a polysilane skeleton (δ=about −95 to −115 ppm) are recognized.

The ratio of the number of N atoms containing in the molecule to that of Si atoms containing in the molecule (in the present invention, sometimes referred to as "N/Si ratio") is preferably 0.9 to 95%, more preferably 2 to 60%.

The N/Si ratio of the polymer molecule can be calculated, for example, from an element ratio obtained by subjecting a film formed using the polymer to elemental analysis by Rutherford backscattering spectroscopy. Specifically, it can be measured as described below. The block copolymer solution comprising the block copolymer solution according to the present invention and the solvent is spin-coated on a 4 inch wafer at a rotation speed of 1,000 rpm using a spin coater (Spin Coater 1HDX2 (trade name), manufactured by Mikasa Co., Ltd.) under a nitrogen atmosphere. The obtained coating film is baked at 240° C. for 10 minutes under a nitrogen atmosphere. The baked film is subjected to elemental analysis by Rutherford backscattering spectrometry using Pelletron 3SDH (trade name, manufactured by National Electrostatics Corporation), whereby an atomic number ratio is measured.

Because of the solubility of the block copolymer in the solvent, the planarization of the block copolymer film and the adhesion to the substrate, the mass average molecular weight of the block copolymer according to the present invention is preferably 1,100 to 25,000, more preferably 2,000 to 20,000, and particularly preferably 2,500 to 10,000. The mass average molecular weight is a mass average molecular weight in terms of polystyrene, and it can be measured by gel permeation chromatography based on polystyrene.

Although the method for producing the block copolymer used for the present invention is not particularly limited, the production method, for example, comprises:

(A) a step of irradiating a cyclic polysilane comprising 5 or more silicon with light;

(B) a step of preparing a mixture comprising the light-irradiated cyclic polysilane comprising 5 or more silicon and a polysilazane comprising 20 or more silicon; and (C) a step of irradiating said mixture with light.

Hereinafter, an example of the production method is described for each step.

(A) Step of Irradiating Cyclic Polysilane Comprising 5 or More Silicon with Light The cyclic polysilane comprising 5 or more silicon (hereinafter sometimes referred to as "cyclic polysilane") used in the production method according to the present invention can be freely selected unless it impairs the effect of the present invention. These are either inorganic compounds or organic compounds and can be linear, branched, or partially having a cyclic structure.

Preferably, the cyclic polysilane is represented by the following formula (I-5):

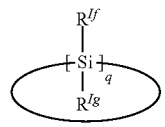
(I-5)

wherein, $R^{If}$ and $R^{Ig}$ are each independently hydrogen, halogen, $C_{1-6}$ alkyl or $C_{6-10}$ aryl, and q is an integer of 5 or more.

Preferably, q is 5 to 8, more preferably 5 or 6.

Examples of the preferred cyclic polysilane include silyl cyclopentasilane, silyl cyclohexasilane, disilyl cyclohexasilane, cyclopentasilane and cyclohexasilane, preferably cyclopentasilane or cyclohexasilane.

The wavelength of irradiation light in the step (A) preferably comprises at least a wavelength of 172 to 405 nm, more preferably 282 to 405 nm. The irradiation intensity is preferably 10 to 250 mW/cm², more preferably 50 to 150 mW/cm², and the irradiation time is preferably 30 to 300 seconds, more preferably 50 to 200 seconds.

Since cyclopentasilane or cyclohexasilane is a liquid at room temperature, light can be irradiated to the cyclic polysilane being in its liquid state while stirring. In addition, when cyclosilane is a solid, it can be dissolved in an appropriate solvent and irradiated with light while stirring.

It is considered that some or all of the cyclic polysilane undergo ring-opening reaction by the light irradiation in this step.

(B) Step of Preparing Mixture Comprising the Light-Irradiated Cyclic Polysilane Comprising 5 or More Silicon and Polysilazane Comprising 20 or More Silicon In this step, a mixture comprising the cyclic polysilane irradiated with light in the step (A) and a polysilazane comprising 20 or more silicon (hereinafter sometimes referred to as "polysilazane") is prepared. It is preferred that the mixture further comprises a crosslinking agent comprising silicon.

The polysilazane used in the production method according to the present invention can be freely selected unless it impairs the effect of the present invention. These are either inorganic compounds or organic compounds, and can be linear, branched, or partially having a cyclic structure.

The polysilazane used in the production method according to the present invention is preferably comprises at least 20 repeating units selected from the group consisting of the following formulae (II-1) to (II-6):

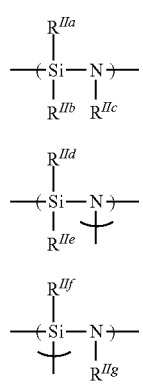

(II-1)

(II-2)

(II-3)

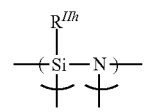
(II-4)

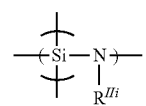
(II-5)

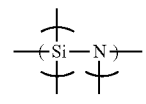
(II-6)

wherein $R^{IIa}$ to $R^{IIi}$ are each independently hydrogen or $C_{1-4}$ alkyl.

More preferably, the polysilazane used in the production method according to the present invention is perhydropolysilazane (hereinafter referred to as "PHPS"). PHPS is a silicon-containing polymer comprising Si—N bonds as repeating units and consisting only of Si, N and H. In this PHPS, except Si—N bond, all elements binding to Si or N are H and any other elements such as carbon or oxygen are not substantially contained. The simplest structure of the perhydropolysilazane is a chain structure having a repeating unit of the following formula:

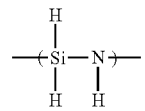

In the present invention, any PHPS having a chain structure and a cyclic structure in the molecule can be used, and examples of the PHPS include those comprising repeating units represented by the following formulae (IIa) to (IIf) and a terminal group represented by the following formula (IIg) in the molecule:

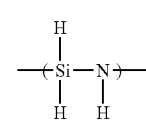
(IIa)

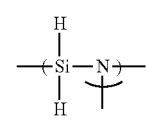
(IIb)

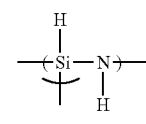
(IIc)

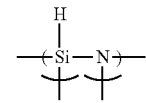
(IId)

-continued

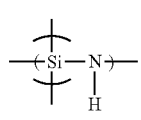
(IIe)

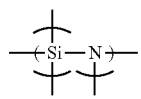
(IIf)

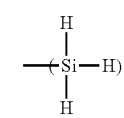
(IIg)

Such a PHPS is one having a branched structure or a cyclic structure in the molecule, and an example of a specific partial structure of such a PHPS is one represented by the following formula:

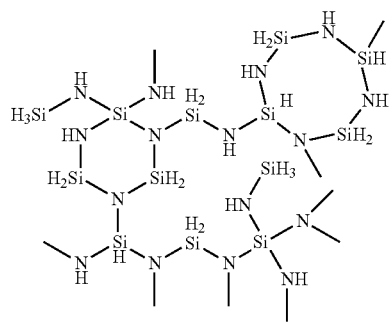

Further, it has or has not a structure represented by the following formula, i.e. a structure wherein plural Si—N molecular chains are crosslinked:

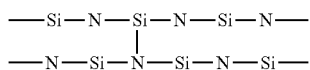

As far as the PHPS according to the present invention comprises Si—N bonds as the repeating unit and is a silicon-containing polymer consisting only of Si, N and H, its structure is not limited, and other various structures exemplified above are possible. For example, it can be one having a structure composed by combining the above-described linear structure, cyclic structure and crosslinked structure. In addition, the PHPS in the present invention is preferably one having a cyclic structure or crosslinked structure, particularly crosslinked structure.

From the viewpoint of the solubility in solvents and the reactivity, the mass average molecular weight of the polysilazane used in the production method according to the present invention is preferably 900 to 15,000, more preferably 900 to 10,000. The mass average molecular weight is a mass average molecular weight in terms of polystyrene, and it can be measured by gel permeation chromatography based on polystyrene.

The crosslinking agent used in the production method of the present invention comprises silicon. This crosslinking agent is preferably bifunctional or higher functional. Examples of such a crosslinking agent include a halogenated silane compound, an alkoxysilane compound, and specifically hexachlorodisilane, 1,1,2,2-tetrachloro-1,2-dimethyldisilane, 1,2-dichlorodisilane, 1,1-dichlorodisilane, 1,2-dichlorotetramethyldisilane, octachlorotrisilane, 1,1,1,3,3,3-hexachloro-2,2-dimethyltrisilane, dichlorosilane, methyldichlorosilane, dichlorodimethylsilane, trichlorosilane, methyltrichlorosilane, hexachlorodisilazane, tetrachlorodisilazane, hexachlorodisiloxane, 1,1,3,3-tetrachloro-1,3-dimethyldisiloxane, 1,3-dichloro-1,1,3,3-tetramethyldisiloxane, 1,3-dichlorodisiloxane, bistrichlorosilylacetylene, 1,2-bistrichlorosilylethene, 1,2-bisdichloromethylsilylethene, trimethoxysilane, methyltrimethoxysilane, methyldimethoxysilane, dimethoxydimethylsilane, triethoxysilane, diethoxysilane, methyldiethoxysilane, diethoxydimethylsilane, and the like.

This crosslinking agent crosslinks a polysilane and a polysilazane, polysilane each other or polysilazane each other. Since the block copolymer that is crosslinked in this way suppresses the phase separation between the block A and the block B, it is considered that forming a uniform film becomes easier at the time of forming a cured film.

The molecular weight of the crosslinking agent used in the production method of the present invention is preferably 100 to 350, more preferably 125 to 270.

(C) Step of Irradiating Said Mixture with Light

It is considered that the reaction of polycondensation of the block A and the block B occurs by light irradiation in this step. The wavelength of irradiation light at this time preferably includes at least a wavelength of 172 to 405 nm, more preferably 282 to 405 nm. The irradiation intensity is preferably 10 to 250 mW/cm$^2$, more preferably 50 to 150 mW/cm$^2$, and the irradiation time is preferably 5 to 100 minutes, more preferably 5 to 60 minutes. The irradiation energy is preferably 3 to 1,500 J, more preferably 25 to 500 J.

The above-mentioned steps (A) to (C) are preferably carried out under an inert gas atmosphere.

After the step (C), a solvent such as cyclooctane is added, and byproducts are removed by filtration using a filter to obtain the block polymer used for the present invention. This product is the block copolymer of the invention having two types of blocks.

(b) Solvent

The composition according to the present invention comprises a solvent. The solvent is selected from those which uniformly dissolve or disperse each component contained in the composition. Specifically, examples of the solvent include ethylene glycol monoalkyl ethers, such as ethylene glycol monomethyl ether, ethylene glycol monoethyl ether, ethylene glycol monopropyl ether and ethylene glycol monobutyl ether; diethylene glycol dialkyl ethers, such as diethylene glycol dimethyl ether, diethylene glycol diethyl ether, diethylene glycol dipropyl ether and diethylene glycol dibutyl ether; ethylene glycol alkyl ether acetates, such as methyl cellosolve acetate and ethyl cellosolve acetate; propylene glycol monoalkyl ethers, such as propylene glycol monomethyl ether (PGME) and propylene glycol monoethyl ether; propylene glycol alkyl ether acetates such as propylene glycol monomethyl ether acetate (PGMEA), propylene glycol monoethyl ether acetate and propylene glycol monopropyl ether acetate; aromatic hydrocarbons, such as benzene, toluene, xylene and mesitylene; ketones, such as methyl ethyl ketone, acetone, methyl amyl ketone, methyl isobutyl ketone and cyclohexanone; alcohols, such as isopropanol and propanediol; and alicyclic hydrocarbons, such as cyclooctane and decalin. Preferred are cyclooctane, toluene, decalin and mesitylene.

These solvents can be used alone or in combination of two or more of any of these.

In order to homogeneously dissolve polymer, the relative dielectric constant of the solvent is preferably 3.0 or less, more preferably 2.5 or less on the basis of the value described in "Solvent Handbook, 1st Edition", Kodansha Scientific.

Although the mixing ratio of the solvent varies depending on the coating method and the film thickness after coating, the ratio (solid content ratio) of the compounds other than the solvent is 1 to 96 mass %, and preferably 2 to 60 mass %.

The composition used in the present invention essentially comprises the above-mentioned (a) and (b), but if necessary, further compounds can be combined. The materials which can be combined are described below. The components other than (a) and (b) contained in the whole composition are preferably 10% or less, and more preferably 5% or less, based on the total mass.

(c) Optional Components

In addition, the composition according to the present invention can contain optional components, if needed. Such optional components include, for example, surfactants.

Surfactants are preferably used because they can improve the coating properties. The surfactants which can be used in the siloxane composition of the present invention include nonionic surfactants, anionic surfactants, amphoteric surfactants, and the like.

Examples of the nonionic surfactant include, polyoxyethylene alkyl ethers, such as polyoxyethylene lauryl ether, polyoxyethylene oleyl ether and polyoxyethylene cetyl ether; polyoxyethylene fatty acid diester; polyoxyethylene fatty acid monoester; polyoxyethylene polyoxypropylene block polymer; acetylene alcohol; acetylene glycols; acetylene alcohol derivatives, such as polyethoxylate of acetylene alcohol; acetylene glycol derivatives, such as polyethoxylate of acetylene glycol; fluorine-containing surfactants, for example, FLUORAD (trade name, manufactured by 3M Japan Limited), MEGAFAC (trade name: manufactured by DIC Cooperation), SURFLON (trade name, manufactured by AGC Inc.); or organosiloxane surfactants, for example, KP341 (trade name, manufactured by Shin-Etsu Chemical Co., Ltd.), and the like. Examples of said acetylene glycol include 3-methyl-1-butyne-3-ol, 3-methyl-1-pentyn-3-ol, 3,6-dimethyl-4-octyne-3,6-diol, 2,4,7,9-tetramethyl-5-decyne-4,7-diol, 3,5-dimethyl-1-hexyne-3-ol, 2,5-dimethyl-3-hexyne-2,5-diol, 2,5-dimethyl-2,5-hexane-diol, and the like.

Further, examples of the anionic surfactant include ammonium salt or organic amine salt of alkyl diphenyl ether disulfonic acid, ammonium salt or organic amine salt of alkyl diphenyl ether sulfonic acid, ammonium salt or organic amine salt of alkyl benzene sulfonic acid, ammonium salt or organic amine salt of polyoxyethylene alkyl ether sulfuric acid, ammonium salt or organic amine salt of alkyl sulfuric acid, and the like.

Further, examples of the amphoteric surfactant include 2-alkyl-N-carboxymethyl-N-hydroxyethyl imidazolium betaine, lauric acid amide propyl hydroxysulfone betaine, and the like.

These surfactants can be used alone or in combination of two or more of any of these, and the mixing ratio thereof is usually 50 to 10,000 ppm, and preferably 100 to 5,000 ppm, based on the total mass of the composition.

<Method for Producing Amorphous Silicon Film>

The method for producing an amorphous silicon film according to the present invention comprises applying the above amorphous silicon forming composition above a substrate to form a coating film and heating the coating film.

The method for coating the composition above a substrate surface can be freely selected from known methods, such as spin coating, dip coating, spray coating, transfer coating, roll coating, bar coating, brush coating, doctor coating, flow coating, slit coating, and the like. Moreover, as a substrate on which the composition is coated, suitable substrates, such as a silicon substrate, a glass substrate, a resin film, can be used. Various semiconductor devices and the like can be formed on these substrates, if necessary. When the substrate is a film, gravure coating can be also used. A drying step can also be provided separately after coating a film if desired. Further, by repeating the coating step once or twice or more as needed, the film thickness of the coating film to be formed can be made as desired.

After forming a coating film of the composition according to the present invention, it is preferred to carry out pre-baking (heating treatment) of the coating film in order to dry the coating film and reduce the residual amount of the solvent. The pre-baking process can be carried out in a non-oxidizing atmosphere preferably at a temperature of 80 to 200° C., in the case of a hot plate for 10 to 300 seconds and in the case of a clean oven for 1 to 30 minutes. In the present invention, the non-oxidizing atmosphere means an atmosphere having an oxygen concentration of 1 ppm or less and a dew point of −76° C. or lower. Preferably, a gas atmosphere of $N_2$, Ar, He, Ne, $H_2$, or a mixture of two or more of any of these is used.

Thereafter, the coating film is heated to cure, thereby forming an amorphous silicon film. So long as it is a temperature at which a coating film having appropriate crystallinity can be obtained, the heating temperature in this heating step is not particularly limited and can be freely determined. However, chemical resistance of the cured film sometimes become insufficient or dielectric constant of the cured film sometimes become increased. From this point of view, for the heating temperature, a relatively high temperature is generally selected. In order to accelerate the curing reaction and obtain a sufficiently cured film, the curing temperature is preferably 200° C. or higher, and more preferably 300° C. or higher. In general, the curing temperature is preferably 1,000° C. or lower, because crystallization of amorphous silicon proceeds. Further, the heating time is not particularly limited and is generally 10 minutes to 24 hours, and preferably 0.001 seconds to 24 hours. Flash annealing can be used for the heating. In addition, this heating time is the time after the temperature of the coating film reaches a desired heating temperature. Normally, it takes several seconds to several hours until the coating film reaches a desired temperature from the temperature before heating. Further, it is preferred that the atmosphere at the time of curing is a non-oxidizing atmosphere.

After forming a coating film using the composition according to the present invention, before said cure step, light irradiation to the coating film can be further carried out. It is possible to suppress the decrease in film thickness in the curing step by light irradiating to the coating film. The light irradiation is preferably to irradiate light having the wavelength of 248 to 436 nm, and more preferably 282 to 405 nm. The irradiation intensity is preferably 10 to 700 $mW/cm^2$, and more preferably 40 to 500 $mW/cm^2$, and the irradiation time is preferably 30 to 3,000 seconds, and more preferably 50 to 2,500 seconds.

The film thickness of the obtained cured film is not particularly limited, but preferably 50 nm to 1 μm, more preferably 100 to 800 nm.

The crystallinity of the formed cured film can be evaluated by X-ray diffraction (XRD). Here, if no diffraction peak of crystalline Si is observed after curing, it is confirmed that the cured film is made of amorphous silicon.

Since the amorphous silicon film is easily dissolved in an aqueous alkaline solution, it is preferably used as a sacrifice film. The aqueous alkaline solution can be properly selected depending on the formed cured film. to be used for the etching is not particularly limited, and examples thereof include aqueous potassium hydroxide solution, aqueous sodium hydroxide solution, ammonia water, aqueous tetramethylammonium hydroxide (TMAH) solution and the like. For example, the etching rate for a 10 mass % aqueous potassium hydroxide solution at room temperature (20 to 30° C.) is preferably 0.1 to 1,000 Å/min, and more preferably 10 to 1,000 Å/min. On the other hand, this amorphous silicon film is resistant to a hydrofluoric acid. Specifically, the etching rate to a 0.5 mass % hydrofluoric acid aqueous solution at room temperature is preferably 0 to 200 Å/min, and more preferably 0 to 50 Å/min.

The resistance to alkaline solution can be controlled by adjusting the conditions of the producing the amorphous silicon film. By raising the heating temperature or lengthening the heating time in forming the amorphous silicon film, the resistance to alkaline solution can be improved.

The method for producing electronic device according to the present invention comprises above mentioned method.

Hereinafter, the present invention is explained with reference to Examples. These Examples are for explanation and are not intended to limit the scope of the present invention.

In the following description, "part" is on a weight basis unless otherwise specified.

The synthesis of the block copolymer and preparing step of the composition in the following Examples and Comparative Examples were all carried out in a glove box controlled to have an oxygen concentration of 1.0 ppm or less and a dew point temperature of −76.0° C. or less under an inert gas atmosphere.

Example 1

A stirrer tip was placed in a 6 mL screw tube, and 292 mg (1.62 mmol) of cyclohexasilane was added thereto and stirred using a stirrer. Here, 8.6 J/cm$^2$ of ultraviolet ray having a wavelength of 365 nm using a LED lamp as a light source was irradiated. After the ultraviolet irradiation, 35.0 mg (0.389 mmol) of polyperhydrosilazane solution adjusted to 50 mass % with cyclooctane and having a mass average molecular weight of 1,800 was added. While continuing to stir, ultraviolet ray having a wavelength of 365 nm using a mercury xenon lamp as a light source was irradiated through an optical fiber at an irradiation intensity of 82 mW/cm$^2$ for 20 minutes, to form a block copolymer. After the reaction, cyclooctane was added so that the concentration of the block copolymer is 25 mass %, and after stirring for 3 minutes, filtration was carried out using a 5.0 μm PTFE filter (Syringe filter, manufactured by Whatman) and 0.2 μm PTFE filter (DISMIC-13JP, manufactured by Advantec), to obtain an amorphous silicon forming composition A. The mass average molecular weight of the synthesized block copolymer was 2,820.

The amorphous silicon forming composition A was coated on a Si substrate in a nitrogen atmosphere using a spin coater (Spin Coater 1HDX2 (trade name), manufactured by Mikasa Co., Ltd.) to form a coating film. Then, 18 J/cm$^2$ of light having the wavelength of 405 was irradiated. The obtained coating film was heated at 150° C. for 30 seconds on a hot plate in nitrogen. Thereafter, the obtained film was heated at 400° C. for 15 minutes on a hot plate to obtain an amorphous silicon film.

When the obtained film was measured by secondary ion mass spectrometry (SIMS), the result thereof was as follows: Si: 97.99 mass %, O: 0.41 mass %, N: 0.92 mass %, C: 0.63 mass %, and H: 0.05 mass %. The diffraction peak of crystalline Si was not observed from the measurement of XRD, by which it was confirmed that the silicon was amorphous silicon.

The film thickness of the obtained amorphous silicon film was 3,330 Å, and the refractive index (633 nm) thereof was 3.07. The membrane stress measured with Tencor (trademark) FLX-2320 manufactured by KLA Tencor was 334 MPa tensile stress.

Further, it was etched in a 10 mass % potassium hydroxide aqueous solution, and the etching rate was 258 Å/min. On the other hand, by the etching using a 0.5 mass % hydrofluoric acid aqueous solution, the etching rate was 6 Å/min, which showed that the film had HF resistance.

Example 2

A stirrer tip was placed in a 6 mL screw tube, and 284 mg (1.58 mmol) of cyclohexasilane was added thereto and stirred using a stirrer. Here, 8.6 J/cm$^2$ of ultraviolet ray having a wavelength of 365 nm using a mercury xenon lamp as a light source was irradiated. After the ultraviolet irradiation, 35.3 mg (0.392 mmol) of polyperhydrosilazane solution adjusted to 50 mass % with cyclooctane and having a mass average molecular weight of 1,800 was added. While continuing to stir, ultraviolet ray having a wavelength of 405 nm using a mercury xenon lamp as a light source was irradiated through an optical fiber at an irradiation intensity of 82 mW/cm$^2$ for 20 minutes, to form a block copolymer. After the reaction, cyclooctane was added so that the concentration of the block copolymer is 25 mass %, and after stirring for 3 minutes, filtration was carried out using a 5.0 μm PTFE filter and 0.2 μm PTFE filter, to obtain an amorphous silicon forming composition B. The mass average molecular weight of the synthesized block copolymer was 2,580.

The amorphous silicon forming composition B was treated as in Example 1 to form an amorphous silicon forming composition.

The film thickness of the obtained amorphous silicon film was 2,969 Å, and the refractive index (633 nm) thereof was 3.15. The membrane stress was 321 MPa.

Further, it was etched in a 10 mass % potassium hydroxide aqueous solution, and the etching rate was 191 Å/min. On the other hand, by the etching using a 0.5 mass % hydrofluoric acid aqueous solution, the etching rate was 4 Å/min, which showed that the film had HF resistance.

Example 3

A stirrer tip was placed in a 6 mL screw tube, and 281 mg (1.56 mmol) of cyclohexasilane was added thereto and stirred using a stirrer. Here, 8.4 J/cm$^2$ of ultraviolet ray having a wavelength of 405 nm using a mercury xenon lamp as a light source was irradiated. After the ultraviolet irradiation, 35 mg (0.390 mmol) of polyperhydrosilazane solution adjusted to 50 mass % with cyclooctane and having a mass average molecular weight of 1,800 was added. While continuing to stir, ultraviolet ray having a wavelength of 405 nm using a mercury xenon lamp as a light source was irradiated through an optical fiber at an irradiation intensity of 82 mW/cm² for 20 minutes, to form a block copolymer. After the reaction, cyclooctane was added so that the concentration of the block copolymer is 25 mass %, and after stirring for 3 minutes, filtration was carried out using a 5.0 μm PTFE filter and 0.2 μm PTFE filter, to obtain an amorphous silicon forming composition C. The mass average molecular weight of the synthesized block copolymer was 2,480.

The amorphous silicon forming composition C was treated as in Example 1 to form an amorphous silicon forming composition.

The film thickness of the obtained amorphous silicon film was 4,162 Å, and the refractive index (633 nm) thereof was 3.19. The membrane stress was 372 MPa.

Further, it was etched in a 10 mass % potassium hydroxide aqueous solution, and the etching rate was 216 Å/min. On the other hand, by the etching using a 0.5 mass % hydrofluoric acid aqueous solution, the etching rate was 4 Å/min, which showed that the film had HF resistance.

Example 4

A stirrer tip was placed in a 6 mL screw tube, and 927 mg (5.15 mmol) of cyclohexasilane was added thereto and stirred using a stirrer. Here, 8.6 J/cm² of ultraviolet ray having a wavelength of 365 nm using a mercury xenon lamp as a light source was irradiated. After the ultraviolet irradiation, 46 mg (0.510 mmol) of polyperhydrosilazane solution adjusted to 50 mass % with cyclooctane and having a mass average molecular weight of 1,800 was added. While continuing to stir, ultraviolet ray having a wavelength of 405 nm using a mercury xenon lamp as a light source was irradiated through an optical fiber at an irradiation intensity of 82 mW/cm² for 20 minutes, to form a block copolymer. After the reaction, cyclooctane was added so that the concentration of the block copolymer is 25 mass %, and after stirring for 3 minutes, filtration was carried out using a 5.0 μm PTFE filter and 0.2 μm PTFE filter, to obtain an amorphous silicon forming composition D. The mass average molecular weight of the synthesized block copolymer was 2,250.

In the same manner as in Example 1 except that the amorphous silicon forming composition D was used and the obtained film was heated at 600° C. for 15 minutes on a hot plate, an amorphous silicon film was obtained.

The film thickness of the obtained amorphous silicon film was 3,343 Å, and the refractive index (633 nm) thereof was 4.16. The membrane stress was 263 MPa.

Further, it was etched in a 10 mass % potassium hydroxide aqueous solution, and the etching rate was 20 Å/min. The etching rate to a 10 mass % aqueous tetramethylammonium hydroxide at 60° C. was 2,020 Å/min. On the other hand, by the etching using a 0.5 mass % hydrofluoric acid aqueous solution, the etching rate was 3 Å/min, which showed that the film had HF resistance.

Example 5

A stirrer tip was placed in a 50 mL screw tube, and 0.35 g (1.94 mmol) of cyclohexasilane was added thereto and stirred using a stirrer. Here, 8.6 J/cm² of ultraviolet ray having a wavelength of 365 nm using a mercury xenon lamp as a light source was irradiated. After the ultraviolet irradiation, 10.8 g (120.2 mmol) of polyperhydrosilazane solution adjusted to 50 mass % with cyclooctane and having a mass average molecular weight of 1,200, and 0.16 g (1.15 mmol) of trichlorosilane as a crosslinking agent were added.

While continuing to stir, ultraviolet ray having a wavelength of 405 nm using a mercury xenon lamp as a light source was irradiated through an optical fiber at an irradiation intensity of 82 mW/cm² for 20 minutes, to form a block copolymer. After the reaction, cyclooctane was added so that the concentration of the block copolymer is 25 mass %, and after stirring for 3 minutes, filtration was carried out using a 5.0 μm PTFE filter and 0.2 μm PTFE filter, to obtain an amorphous silicon forming composition E. The mass average molecular weight of the synthesized block copolymer was 7,750.

In the same manner as in Example 1 except that the amorphous silicon forming composition E was used and the obtained film was heated at 600° C. for 15 minutes on a hot plate, an amorphous silicon film was obtained.

The film thickness of the obtained amorphous silicon film was 3,653 Å, and the refractive index (633 nm) thereof was 3.16. The membrane stress was 323 MPa.

Further, it was etched in a 10 mass % potassium hydroxide aqueous solution, and the etching rate was 15 Å/min. The etching rate to a 10 mass % aqueous tetramethylammonium hydroxide at 60° C. was 2,970 Å/min. On the other hand, by the etching using a 0.5 mass % hydrofluoric acid aqueous solution, the etching rate was 8 Å/min, which showed that the film had HF resistance.

Example 6

A stirrer tip was placed in a 6 mL screw tube, and 223 mg (1.24 mmol) of cyclohexasilane was added thereto and stirred using a stirrer. Here, 8.6 J/cm² of ultraviolet ray having a wavelength of 365 nm using a mercury xenon lamp as a light source was irradiated. After the ultraviolet irradiation, 446 mg (4.96 mmol) of polyperhydrosilazane solution adjusted to 50 mass % with cyclooctane and having a mass average molecular weight of 1,800 was added. While continuing to stir, ultraviolet ray having a wavelength of 405 nm using a mercury xenon lamp as a light source was irradiated through an optical fiber at an irradiation intensity of 82 mW/cm² for 20 minutes, to form a block copolymer. After the reaction, cyclooctane was added so that the concentration of the block copolymer is 25 mass %, and after stirring for 3 minutes, filtration was carried out using a 5.0 μm PTFE filter and 0.2 μm PTFE filter, to obtain an amorphous silicon forming composition F. The mass average molecular weight of the synthesized block copolymer was 2,810.

In the same manner as in Example 1 except that the amorphous silicon forming composition F was used and the obtained film was heated at 600° C. for 15 minutes on a hot plate, an amorphous silicon film was obtained.

The film thickness of the obtained amorphous silicon film was 2,916 Å, and the refractive index (633 nm) thereof was 3.01. The membrane stress was 463 MPa.

Further, it was etched in a 10 mass % potassium hydroxide aqueous solution, and the etching rate was 10 Å/min. The etching rate to a 10 mass % aqueous tetramethylammonium hydroxide at 60° C. was 2,450 Å/min. On the other hand, by the etching using a 0.5 mass % hydrofluoric acid aqueous solution, the etching rate was 5 Å/min, which showed that the film had HF resistance.

Comparative Example 1

A stirrer tip was placed in a 6 mL screw tube, and 272 mg (1.5 mmol) of cyclohexasilane was added thereto and stirring was carried out using a stirrer. Here, 8.6 J/cm² of ultraviolet ray having the wavelength of 365 nm was irradiated using a mercury xenon lamp as a light source. After the irradiation, 98.4 J/cm² of ultraviolet ray having the wavelength of 365 nm was irradiated using a mercury xenon lamp as a light source. Thereafter, cyclooctane was added so as to make the solid content concentration become 19 mass % and stirring was carried out for 3 minutes. Then, filtration was performed using a 5.0 μm PTFE filter and 0.2 μm PTFE filter to obtain a comparative composition A.

The comparative composition A was coated on a Si substrate in a nitrogen atmosphere using a spin coater to try to form a coating film, but the comparison composition A was not able to be coated on the substrate and did not lead to film formation.

Comparative Example 2

A stirrer tip was placed in a 6 mL screw tube, and 297 mg (1.65 mmol) of cyclohexasilane was added thereto and stirring was carried out using a stirrer. Here, 8.6 J/cm² of ultraviolet ray having a wavelength of 365 nm using a LED lamp as a light source was irradiated. After the ultraviolet irradiation, 37.1 mg (0.412 mmol) of polyperhydrosilazane solution adjusted to 50 mass % with cyclooctane and having a mass average molecular weight of 1,800 was added. Thereafter, cyclooctane was added so as to make the solid content concentration become 25 mass % and stirring was carried out for 3 minutes. Then, filtration was performed using a 5.0 μm PTFE filter and 0.2 μm PTFE filter to obtain a comparative composition B.

In the same manner as in Example 1 except that the comparative composition B was used, an amorphous silicon film was obtained.

The film thickness of the obtained amorphous silicon film was 755 Å, and the refractive index (633 nm) thereof was 2.95. The membrane stress was 268 MPa.

Further, it was etched in a 10 mass % potassium hydroxide aqueous solution, and the etching rate was 147 Å/min. On the other hand, by the etching using a 0.5 mass % hydrofluoric acid aqueous solution, the etching rate was 6 Å/min, which showed that the film had HF resistance.

Comparative Example 3

20 mass % polyperhydrosilazane having a mass average molecular weight of 5,800 in cyclooctane solution was prepared. After a coating film was formed in the same manner as in Example 1, the film was heated at 150° C. for 60 seconds on a hot plate (pre-bake). Then, it was heated at 400° C. for 15 minutes on a hot plate and a film of a comparative example 3 was obtained.

The film thickness of the obtained oxynitride siliceous film was 6100 Å, and the refractive index (633 nm) thereof was 1.57. The membrane stress was −340 MPa compression stress.

Further, it was etched in a 10 mass % potassium hydroxide aqueous solution, and the etching rate was 1,178 Å/min. On the other hand, by the etching using a 0.5 mass % hydrofluoric acid aqueous solution, the etching rate was 4,245 Å/min.

The invention claimed is:

1. An amorphous silicon forming composition comprising:
   (a) a block copolymer comprising a linear and/or cyclic block A having a polysilane skeleton comprising 5 or more silicon and a block B having a polysilazane skeleton comprising 20 or more silicon, wherein at least one silicon in the block A and at least one silicon in the block B are connected by a single bond and/or a crosslinking group comprising silicon, and
   (b) a solvent,
   wherein the ratio of the compounds other than the solvent is 1 to 96 mass percent.

2. The composition according to claim 1, wherein
   the block A comprises 5 or more repeating units selected from the group consisting of the following formulae (I-1) to (I-3):

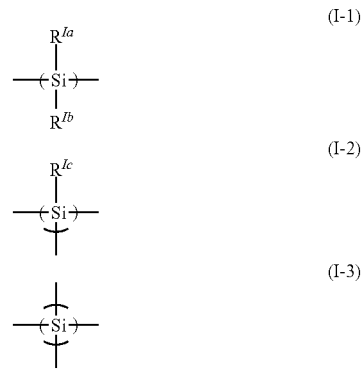

(wherein $R^{Ia}$, $R^{Ib}$, and $R^{Ic}$ are each independently hydrogen, halogen, $C_{1-6}$ alkyl or $C_{6-10}$ aryl), and the block B comprises 20 or more repeating units selected from the group consisting of the following formulae (II-1) to (II-6):

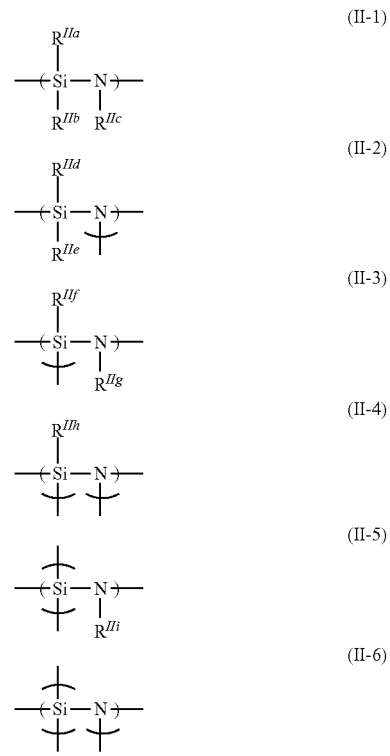

(wherein $R^{IIa}$ to $R^{IIi}$ are each independently hydrogen or $C_{1-4}$ alkyl).

3. The composition according to claim 1, wherein the mass average molecular weight of the block copolymer is 1,100 to 25,000.

4. The composition according to claim 1, wherein the ratio of the number of N atoms containing in the block copolymer to that of Si atoms containing in the block copolymer is 0.9 to 95%.

5. The composition according to claim 2, wherein the ratio of the total number of the repeating units of formulae (I-1) to (I-3) to that of the repeating units of the formulae (II-1) to (II-6) containing in the block copolymer is 0.3 to 114%.

6. The composition according to claim 2, wherein all of $R^{Ia}$, $R^{Ib}$ and $R^{Ic}$ in the block A are hydrogen.

7. The composition according to claim 2, wherein all of $R^{IIa}$ to $R^{IIi}$ in the block B are hydrogen.

8. The composition according to claim 1, wherein the block copolymer comprises a main chain comprising the block B and a side chain comprising the block A.

9. The composition according to claim 1, wherein at least one of the block A is represented by the following formula (I-4):

wherein
$R^{Id}$ and $R^{Ie}$ are each independently hydrogen, halogen, $C_{1-6}$ alkyl, $C_{6-10}$ aryl or a single bond, provided that at least one of $R^{Id}$ and $R^{Ie}$ is a single bond, and
p is an integer of 5 or more.

10. The composition according to claim 1, wherein between the block A and another block A, between the block B and another block B, or between the block A and the block B in the block copolymer is connected by a crosslinking group comprising silicon.

11. The composition according to claim 1, wherein the relative dielectric constant of the solvent is 3.0 or less.

12. A method for producing an amorphous silicon film, comprising:
applying the composition according to claim 1 above a substrate to form a coating film, and
heating the coating film in a non-oxidizing atmosphere.

13. The method according to claim 12, wherein light having the wavelength of 248 to 436 nm is irradiated after the formation of the coating film.

14. The method according to claim 12, wherein the heating is performed at 200 to 1,000° C.

15. A method for manufacturing an electronic device, comprising the method according to claim 12.

16. The composition according to claim 1, wherein the ratio of the compounds other than the solvent is 2 to 60 mass percent.

17. The composition according to claim 1, wherein components other than (a) and (b) contained in the whole composition are 10% or less based on the total mass.

18. The composition according to claim 1, wherein components other than (a) and (b) contained in the whole composition are 5% or less based on the total mass.

19. The composition according to claim 1, wherein the relative dielectric constant of the solvent is 2.5 or less.

* * * * *